United States Patent
Zhou

(10) Patent No.: US 11,139,405 B2
(45) Date of Patent: Oct. 5, 2021

(54) METHOD FOR FABRICATING NANOPILLAR SOLAR CELL USING GRAPHENE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Ming Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 56 days.

(21) Appl. No.: 15/477,798

(22) Filed: Apr. 3, 2017

(65) Prior Publication Data
US 2018/0006169 A1  Jan. 4, 2018

(30) Foreign Application Priority Data
Jul. 1, 2016 (CN) .......................... 201610510623.2

(51) Int. Cl.
*H01L 31/18* (2006.01)
*H01L 31/0224* (2006.01)
(Continued)

(52) U.S. Cl.
CPC .... *H01L 31/022425* (2013.01); *C01B 32/184* (2017.08); *H01L 21/02606* (2013.01);
(Continued)

(58) Field of Classification Search
None
See application file for complete search history.

(56) References Cited

U.S. PATENT DOCUMENTS 5,581,091 A * 12/1996 Moskovits ............. B82Y 10/00
257/9
9,147,875 B1 * 9/2015 Coakley ............... H05K 1/0268
(Continued)

FOREIGN PATENT DOCUMENTS

| CN | 103219413 | 7/2013 |
| CN | 103875080 | 6/2014 |

OTHER PUBLICATIONS

European Application No. 17178367.3, Extended European Search Report dated Nov. 3, 2017, 9 pages.
(Continued)

*Primary Examiner* — Dustin Q Dam
(74) *Attorney, Agent, or Firm* — Anova Law Group, PLLC

(57) ABSTRACT

A method of manufacturing a semiconductor device includes providing a substrate structure. The substrate structure includes a conductive layer and a plurality of nanopillars spaced apart from each other overlying the conductive layer. Each nanopillar includes a first semiconductor layer and a second semiconductor layer on the first semiconductor layer. The first semiconductor layer and the second semiconductor layer have different conductivity types. The method also includes forming a graphene layer overlying the plurality of nanopillars. The graphene layer is connected to each of the plurality of nanopillars.

17 Claims, 6 Drawing Sheets

(51) Int. Cl.
  *H01L 31/0352* (2006.01)
  *C01B 32/184* (2017.01)
  *H01L 21/02* (2006.01)
  *H01L 31/02* (2006.01)
  *H01L 31/0236* (2006.01)
  *H01L 31/04* (2014.01)

(52) U.S. Cl.
  CPC .. *H01L 31/02008* (2013.01); *H01L 31/02013* (2013.01); *H01L 31/02021* (2013.01); *H01L 31/02363* (2013.01); *H01L 31/02366* (2013.01); *H01L 31/022466* (2013.01); *H01L 31/035227* (2013.01); *H01L 31/035281* (2013.01); *H01L 31/04* (2013.01); *H01L 31/18* (2013.01); *Y02E 10/50* (2013.01)

(56) References Cited

U.S. PATENT DOCUMENTS

| | | |
|---|---|---|
| 2004/0157354 A1 | 8/2004 | Kuriyama et al. |
| 2006/0207647 A1 | 9/2006 | Tsakalakos et al. |
| 2010/0236619 A1* | 9/2010 | Tsutsumi ........ H01L 31/022433 136/256 |
| 2011/0030772 A1* | 2/2011 | Veerasamy ............ B82Y 30/00 136/256 |
| 2011/0215408 A1* | 9/2011 | Tang .................... H01L 21/845 257/348 |
| 2011/0308564 A1 | 12/2011 | Kempa et al. |
| 2013/0019924 A1 | 1/2013 | Naughton et al. |
| 2013/0102109 A1* | 4/2013 | Stewart ............ H01L 31/02167 438/98 |
| 2013/0213477 A1* | 8/2013 | Nakayama ............ H01L 51/447 136/263 |
| 2014/0096816 A1* | 4/2014 | Atwater ............ H01L 31/02363 136/255 |
| 2014/0326305 A1* | 11/2014 | Baek ................ H01L 31/035227 136/256 |
| 2016/0005602 A1* | 1/2016 | Yoo .................... H01L 21/0338 216/41 |
| 2016/0126416 A1 | 5/2016 | Gilet et al. |
| 2016/0276611 A1* | 9/2016 | Oooka .................. H01L 51/442 |

OTHER PUBLICATIONS

Chinese Application No. 201610510623.2, Office Action dated Jul. 2, 2019, 3 pages.
Chinese Application No. 201610510623.2, Office Action dated Oct. 8, 2018, 6 pages.

* cited by examiner

METHOD FOR FABRICATING NANOPILLAR SOLAR CELL USING GRAPHENE

CROSS-REFERENCES TO RELATED APPLICATIONS

This application claims priority to Chinese patent application No. 201610510623.2, filed on Jul. 1, 2016, the content of which is incorporated herein by reference in its entirety.

BACKGROUND OF THE INVENTION

The present invention relates to a semiconductor device and, more particularly, to a semiconductor device and a method for manufacturing a solar cell.

With the growing global energy tensions, solar energy as a new energy has been vigorously developed. Solar cells are based on semiconductor materials, the use of photovoltaic materials to absorb light energy, and then photoelectric conversion, which will convert light energy. At present solar cells include monocrystalline silicon solar cells, polycrystalline silicon solar cells and amorphous silicon solar cells three categories, the industrialization of the conversion efficiency of solar cells is about 20%, respectively, 17%, 10%. Therefore, the conversion efficiency of existing solar cells is relatively low, it is necessary to propose a new technology program to improve the efficiency of solar cell conversion.

BRIEF SUMMARY OF THE INVENTION

Embodiments of the present invention provide a device structure and method of manufacturing a semiconductor device for improved performance of solar cells.

In some embodiments, the device includes semiconductor nanopillars. The surface area of the nanopillars is significantly increased relative to the conventional planar solar cell, so that the absorption efficiency of the photon can be greatly improved, thereby improving the solar cell conversion efficiency. Further, a graphene layer is used as the electrode to connect the nanopillars of the solar cell and can reduce the contact resistance between the electrode and the semiconductor, thereby improving the carrier mobility, thereby further improving the conversion efficiency of solar cells.

According to some embodiments of the present invention, a method of manufacturing a semiconductor device includes providing a substrate structure. The substrate structure includes a conductive layer and a plurality of nanopillars spaced apart from each other overlying the conductive layer. Each nanopillar includes a first semiconductor layer and a second semiconductor layer on the first semiconductor layer. The first semiconductor layer and the second semiconductor layer have different conductivity types. The method also includes forming a graphene layer overlying the plurality of nanopillars. The graphene layer is connected to each of the plurality of nanopillars. It is understood that due to manufacturing variability, in some cases, some of the nanopillars may not be connected to the graphene layer. In those cases, the plurality of nanopillars is understood to include those nanopillars that are connected to the graphene layer.

In an embodiment of the above method, each of the nanopillars also includes an aluminum layer on the second semiconductor layer.

In another embodiment, the substrate structure also includes a substrate, the conductive layer being disposed on the substrate.

In another embodiment, the substrate structure also includes a third semiconductor layer disposed on the conductive layer, and the material of the third semiconductor layer is the same as the material of the first semiconductor layer. In this case, the plurality of nanopillars is positioned over the third semiconductor layer.

In another embodiment, the step of providing a substrate structure includes:
providing an initial substrate structure, the initial substrate structure comprising:
a conductive layer;
a first semiconductor layer overlying the conductive layer;
a second semiconductor layer on said first semiconductor layer; and
an aluminum layer on the second semiconductor layer;
oxidizing an upper portion of the aluminum layer to form an aluminum oxide layer by an anodic oxidation process in which a plurality of nanopores are formed in the aluminum oxide layer, the nanopores extending from an upper surface of the aluminum oxide layer to a lower portion of the aluminum layer;
filling a plurality of nanopores with a hard mask material;
using the hard mask material in the nanopores as an etch mask to etching sequentially the aluminum oxide layer, the lower portion of the aluminum layer, the second semiconductor layer, and at least a portion of the first semiconductor layer; and
removing the hard mask material, thereby forming the plurality of nanopillars.

In another embodiment, the first semiconductor layer and the second semiconductor layer are silicon, and the method also includes using a Cl (chlorine) ion containing plasma to etch the alumina-containing layer and the aluminum layer with the second semiconductor layer as a plasma etching stop layer, and using a F (florine) ion containing plasma to etch the second semiconductor layer and at least a portion of the first semiconductor.

In another embodiment, the anodic oxidation process is carried out with a voltage of 0-100 V utilizing an electrolyte comprising neutral ammonium pentaborate and ammonium adipate, or an electrolyte comprising phosphoric acid and oxalic acid electrolyte, or a combination of both electrolytes.

In another embodiment, the method further includes after removal of the hard mask, cleaning the surface of the aluminum layer in the nanopillars.

In another embodiment, the transverse dimension of the nanopores is 5-5000 nm.

In another embodiment, the transverse dimension of the nanopillars is 5-5000 nm.

In another embodiment, the formation of the graphene layer includes forming a graphene layer on a metal substrate, and transferring the graphene layer over the plurality of nanopillars.

In another embodiment, the method also includes forming a protective layer on the graphene layer.

In another embodiment, the first semiconductor layer and the second semiconductor layer are formed by the same material.

In another embodiment, the first semiconductor layer and the second semiconductor layer are formed by different material.

According to some embodiments of the present invention, a semiconductor device includes a conductive layer and a plurality of nanopillars spaced apart from each other overlying the conductive layer. Each nanopillar includes a first semiconductor layer and a second semiconductor layer on the first semiconductor layer. The first semiconductor layer is different in conductivity type from the second semiconductor layer. The semiconductor device also has a graphene layer overlying the plurality of nanopillars, the graphene layer being connected to each of the plurality of nanopillars.

In an embodiment of the above device, each of the nanopillars further includes an aluminum layer on the second semiconductor layer.

In another embodiment, the device also includes a third semiconductor layer on the conductive layer, and the material of the third semiconductor layer and the material of the first semiconductor layer are the same. In this case, the plurality of nanopillars are located over the third semiconductor layer.

In another embodiment, the device also includes a substrate, and the conductive layer is disposed on the substrate.

In another embodiment, the device also includes a protective layer on the graphene layer.

In another embodiment, the transverse dimension of the nanopillars is 5-5000 nm.

In another embodiment, the material of the first semiconductor layer is the same as the material of the second semiconductor layer.

In another embodiment, the material of the first semiconductor layer is different than the material of the second semiconductor layer.

A further understanding of the nature and advantages of the present invention may be realized by reference to the remaining portions of the specification and the drawings.

DETAILED DESCRIPTION OF THE INVENTION

Figure 1:
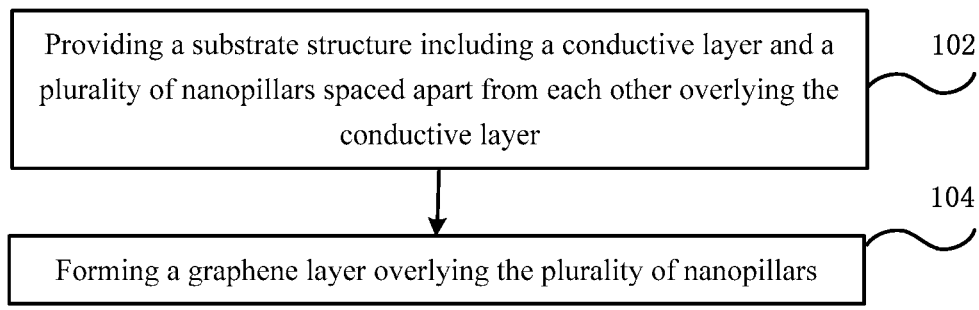
FIG. 1 is a simplified flow chart of a method of manufacturing a semiconductor device according to an embodiment of the present invention.

The various exemplary embodiments of the present invention will now be described in detail with reference to the accompanying drawings. It should be understood that the relative arrangements, numerical expressions, and numerical values of the components and steps set forth in these embodiments should not be construed as limiting the scope of the invention unless otherwise specifically stated.

In addition, it should be understood that the dimensions of the various components shown in the figures are not necessarily drawn in an actual scale relationship for ease of description, such as the thickness or width of certain layers may be exaggerated relative to other layers.

The following description of exemplary embodiments is illustrative only and is not to be taken as a limitation on the invention, its application or use in any sense. Techniques, methods, and apparatuses known to those of ordinary skill in the relevant art may not be discussed in detail, but such techniques, methods, and apparatuses should be considered as part of this description insofar as they apply to such techniques, methods, and apparatuses. It should be noted that like reference numerals and letters designate like items in the following drawings, and therefore, once an item is defined or illustrated in one of the drawings, the detailed description is not repeated.

FIG. 1 is a simplified flow chart of a method of manufacturing a semiconductor device according to an embodiment of the disclosure. As shown in FIG. 1, the method includes the following steps, which is summarized here and explained further with reference to FIGS. 2A-4E.

Step 102, a substrate structure is provided. The substrate structure includes a conductive layer and a plurality of nanopillars spaced apart from each other over the conductive layer. Each of the nanopillars includes a first semiconductor layer and a second semiconductor layer on the first semiconductor layer. The first semiconductor layer and the second semiconductor layer are different in conductivity type. A PN junction is formed at the contact interface of the first semiconductor layer and the second semiconductor layer.

Step 104, a graphene layer is formed on the plurality of nanopillars. The graphene layer is connected to each nanopillar.

The semiconductor device obtained by the manufacturing method provided by the present disclosure can be used as a solar cell. On the one hand, the surface area of the nanopillars is significantly increased relative to the conventional solar cell, so that the absorption efficiency of the photon can be greatly improved, thereby improving the solar cell conversion efficiency. On the other hand, the graphene layer as the electrode of the solar cell can reduce the contact resistance between the electrode and the semiconductor, thereby improving the carrier mobility, thereby further improving the conversion efficiency of solar cells.

Figure 2A:
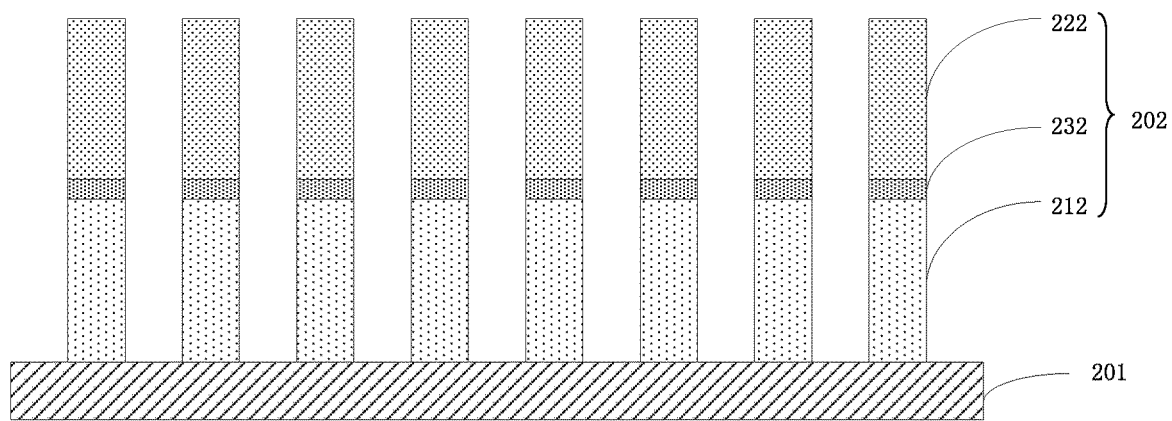
FIG. 2A shows a cross sectional view of a substrate structure according to an embodiment of the present invention.
Figure 2B:
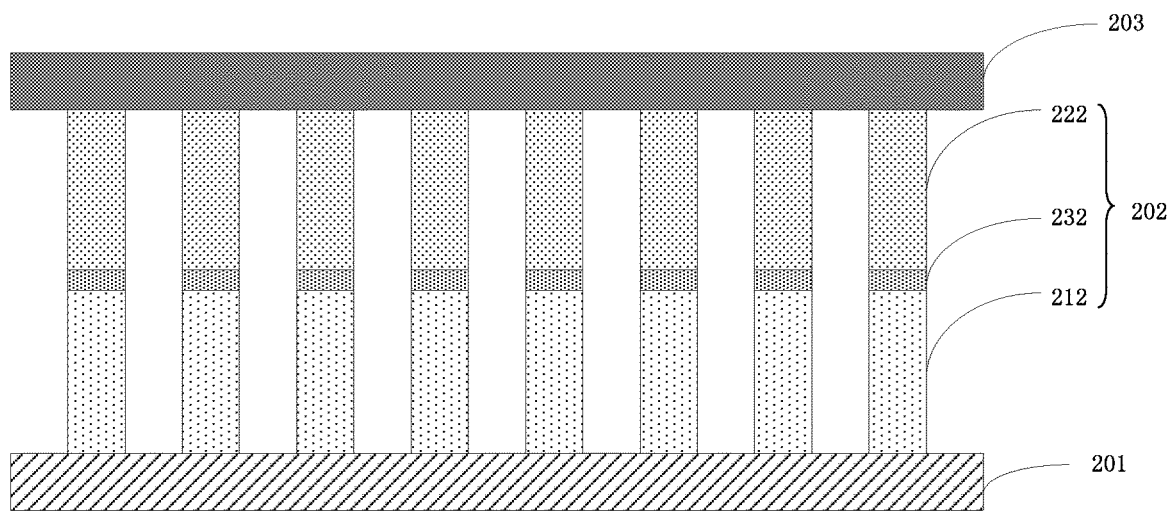
FIG. 2B shows a cross sectional view of the graphene layer formed in a plurality of nanopillars according to an embodiment of the present invention.
Figure 2C:
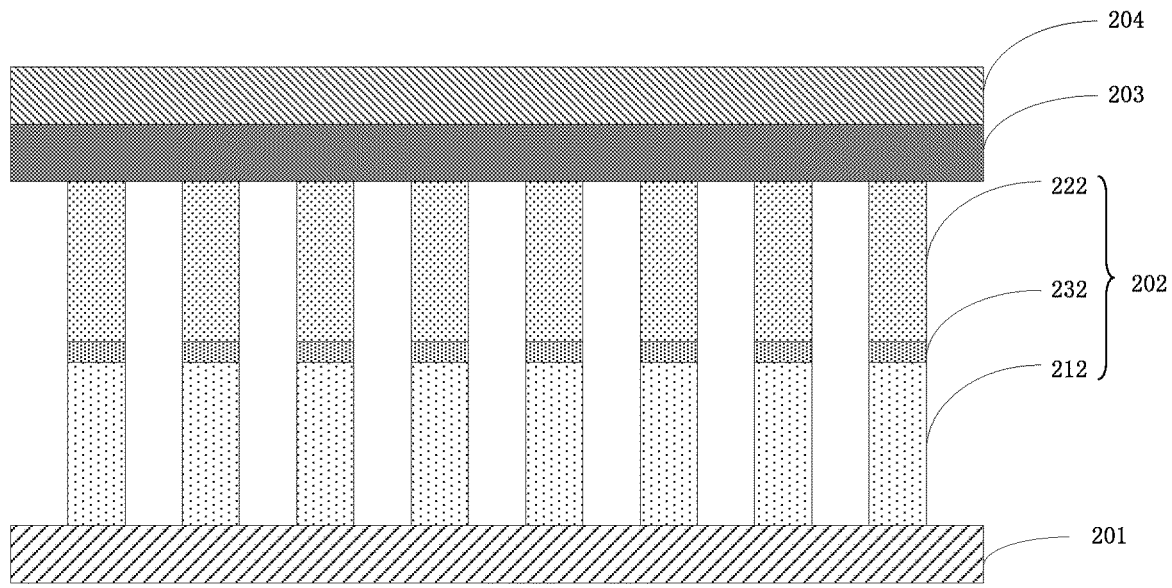
FIG. 2C shows a cross sectional view of forming a protective layer on the graphene layer in accordance with one embodiment of the present invention.

FIGS. 2A-2C illustrate a method of manufacturing a semiconductor device according to one embodiment disclosed in different stages.

First, as shown in FIG. 2A, a substrate structure is provided. The substrate structure includes a conductive layer 201 and a plurality of nanopillars 202 spaced apart from each other over conductive layer 201. The material of the conductive layer 201 may be an electrode of a material such as Al. Each nanopillar 202 includes a first semiconductor layer 212 and a second semiconductor layer 222. Here, the first semiconductor layer 212 and the second semiconductor layer 222 may have different conductive types, so that the contact interface of the first semiconductor layer 212 with the second semiconductor layer 222 may form a PN junction 232. In one embodiment, the semiconductor materials of the first material layer 212 and the second semiconductor layer 222 may be the same, thereby forming a homogeneous PN junction at the contact interface between the first semiconductor layer 212 and the second semiconductor layer 222. In another embodiment, the semiconductor material of the first material layer 212 and the second semiconductor layer 222 may be different, so that they form a heterojunction at the junction interface of the first semiconductor layer 212 and the second semiconductor layer 222. Further, the substrate structure may further include a substrate (not shown), the conductive layer 201 may be located on that substrate, which may be a support substrate.

Thereafter, as shown in FIG. 2B, a graphene layer 203 is formed overlying the plurality of nanopillars 202. In some embodiments, graphene layer 203 is in contact with all the nanopillars. In some cases, e.g., due to variations in the manufacturing process, some nanopillars may not be in contact with the graphene layer. In one embodiment, a graphene layer may be formed on a metal substrate such as copper, platinum, tungsten, or nickel in advance; and then the graphene layer may be transferred over the plurality of nanopillars. For example, the graphene layer can be formed using the following process. Methane, hydrogen, and argon gas are used as precursors, and a graphene layer is deposited on a copper substrate at a temperature of 700-1000° C. by chemical vapor deposition (CVD) or plasma enhanced chemical vapor deposition (PECVD). Then the graphene layer can be transferred to the nanopillars by wet transfer. However, the present disclosure is not limited thereto, and the transfer of graphene may also be carried out by other means.

A description of the device structure of the semiconductor device formed above is presented below with reference to FIG. 2B. The semiconductor device in FIG. 2B includes a conductive layer 201 and a plurality of nanopillars 202 spaced apart from each other over conductive layer 201. Each nanopillar 202 includes a first semiconductor layer 212 and a second semiconductor layer 222. The first semiconductor layer 212 and the second semiconductor layer 222 have different conductive types. The contact interface of the first semiconductor layer 212 with the second semiconductor layer 222 may form a PN junction 232. In one embodiment, the lateral dimensions of the nanopillars may be 5-5000 nm.

Thereafter, as shown in FIG. 2C, a protective layer 204 may be formed on the graphene layer 203 in the semiconductor device shown in FIG. 2B. Preferably, protective layer 204 may be a glass film; more preferably, the protection layer 204 may be a film of silica glass.

Figure 3A:
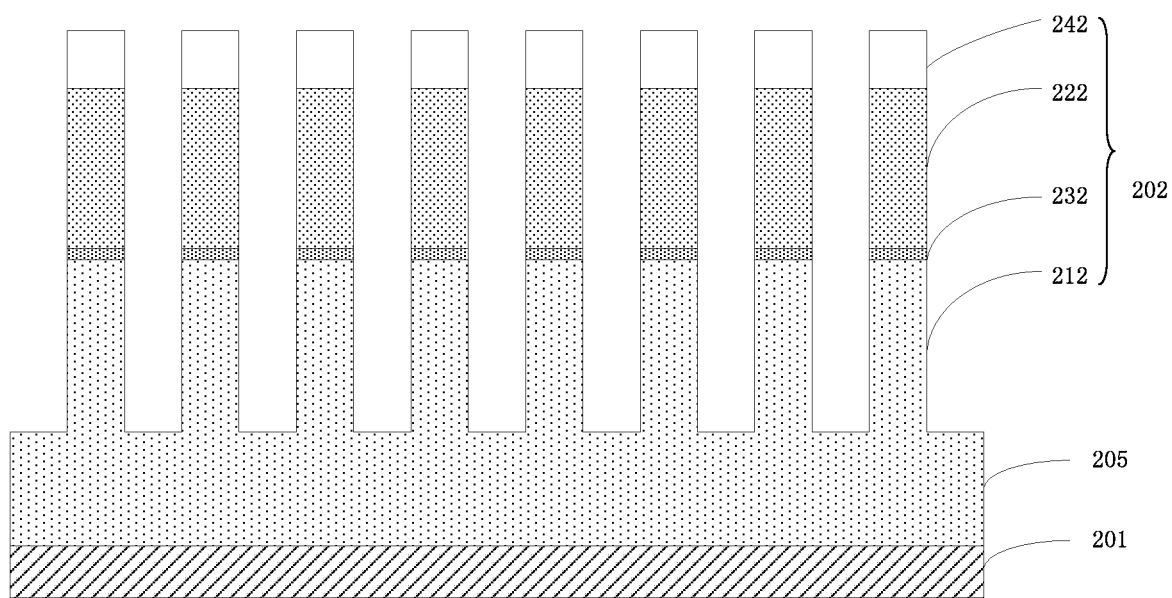
FIG. 3A illustrates a cross sectional view of an example of the structure of the substrate according to another embodiment of the present invention.
Figure 3B:
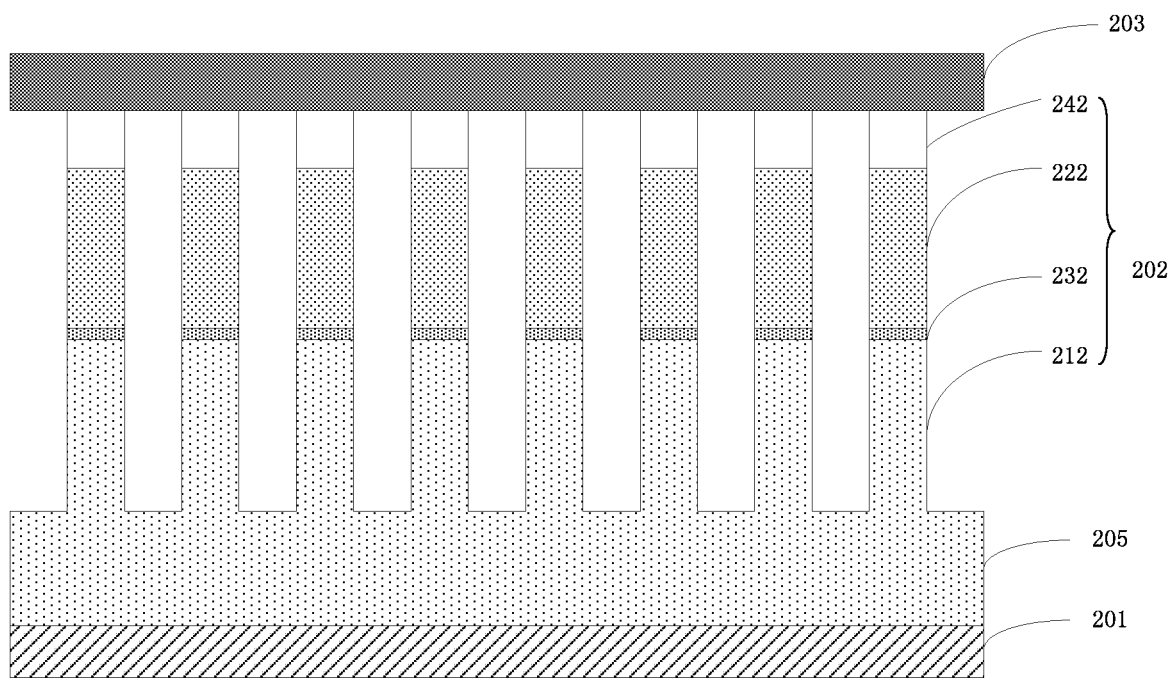
FIG. 3B illustrates a cross sectional view of a graphene layer formed on a plurality of nanopillars according to another embodiment of the present invention.
Figure 3C:
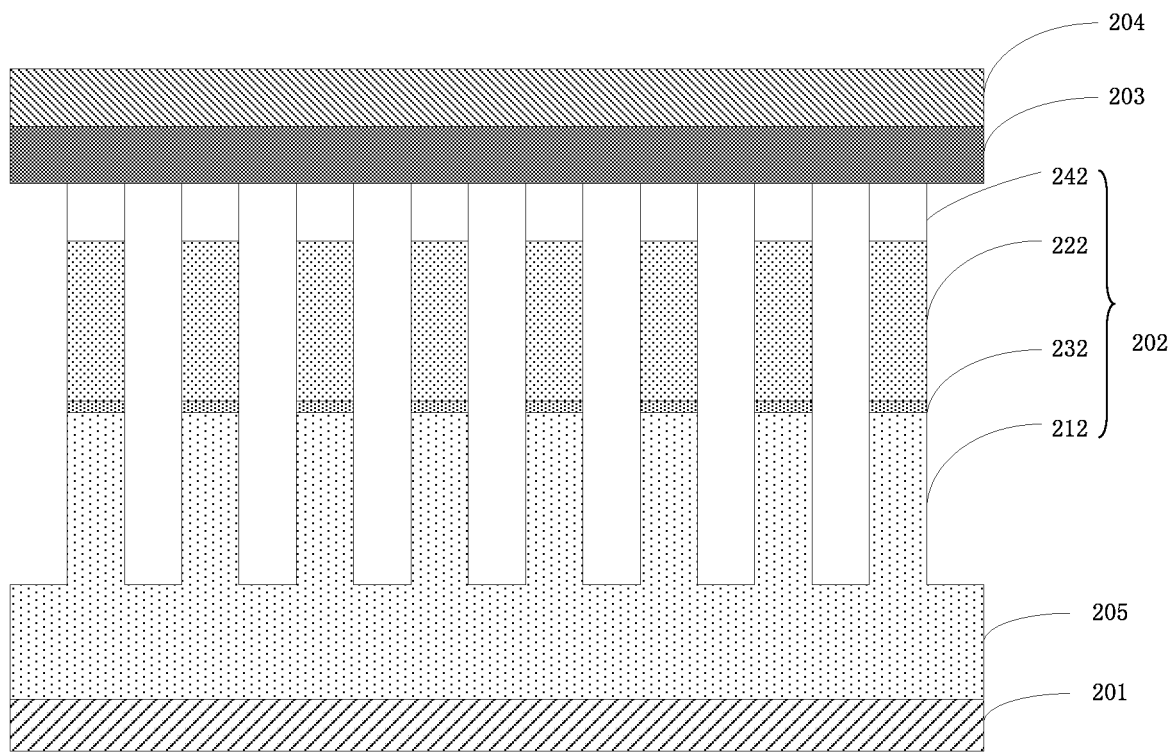
FIG. 3C illustrates a cross sectional view of forming a protection layer on the graphene layer according to another embodiment of the present invention.

FIGS. 3A-3C shows a method of manufacturing a semiconductor device according to an alternative embodiment of the present embodiment. Some of the components in FIGS. 3A-3C are similar to those in FIGS. 2A-2C, and references will be made to the corresponding parts in FIGS. 2A-2C.

First, FIG. 3A shows a substrate structure. Compared with the substrate structure shown in FIG. 2A, in the substrate structure shown in FIG. 3A, each of the nanopillars may also include an aluminum layer 242 on the second semiconductor layer 222. Further, the substrate structure may further include a third semiconductor layer 205 on which the conductive layer 201 is disposed. In this case, the plurality of nanopillars 202 is disposed above the third semiconductor layer 205. Here, the third semiconductor layer 205 and the first semiconductor layer 212 can have the same semiconductor material, e.g., silicon. In FIG. 3A, the third semiconductor layer 205 and the first semiconductor layer 212 are shown as the same material. Similar to FIG. 2A, in FIG. 3A, the contact interface of the first semiconductor layer 212 with the second semiconductor layer 222 may form a PN junction 232.

Then, as shown in FIG. 3B, the graphene layer 203 is formed on the plurality of nanopillars 202. The graphene layer can be formed according to the manner described above. As shown in FIG. 3B, the semiconductor device includes a conductive layer 201, a third semiconductor layer 205 on conductive layer 201, and a plurality of spaced apart nanopillars 202 on the third semiconductor layer 205, and a graphene layer 203 on the plurality of nanopillars. The third semiconductor layer 205 and the first semiconductor layer 212 can be made of the same material. Each nanopillar 202 includes a first semiconductor layer 212, a second semiconductor layer 222 on the first semiconductor layer 212, and an aluminum layer 242 on the second semiconductor layer 222. The first semiconductor layer 212 and the second semiconductor layer 222 have different conductivity types, e.g., one is P-type and the other is N-type, or vice versa. As a result, a PN junction is formed at the contact interface 232 between the first semiconductor layer 212 and the second semiconductor layer 222.

Thereafter, as shown in FIG. 3C, a protection layer 204 may be formed on the graphene layer 203. The protection layer can be, for example, a glass film.

The substrate structures in FIG. 2A and FIG. 3A, and can be formed in different ways. FIGS. 4A-4E, describe a specific implementation of substrate structure.

Figure 4A:
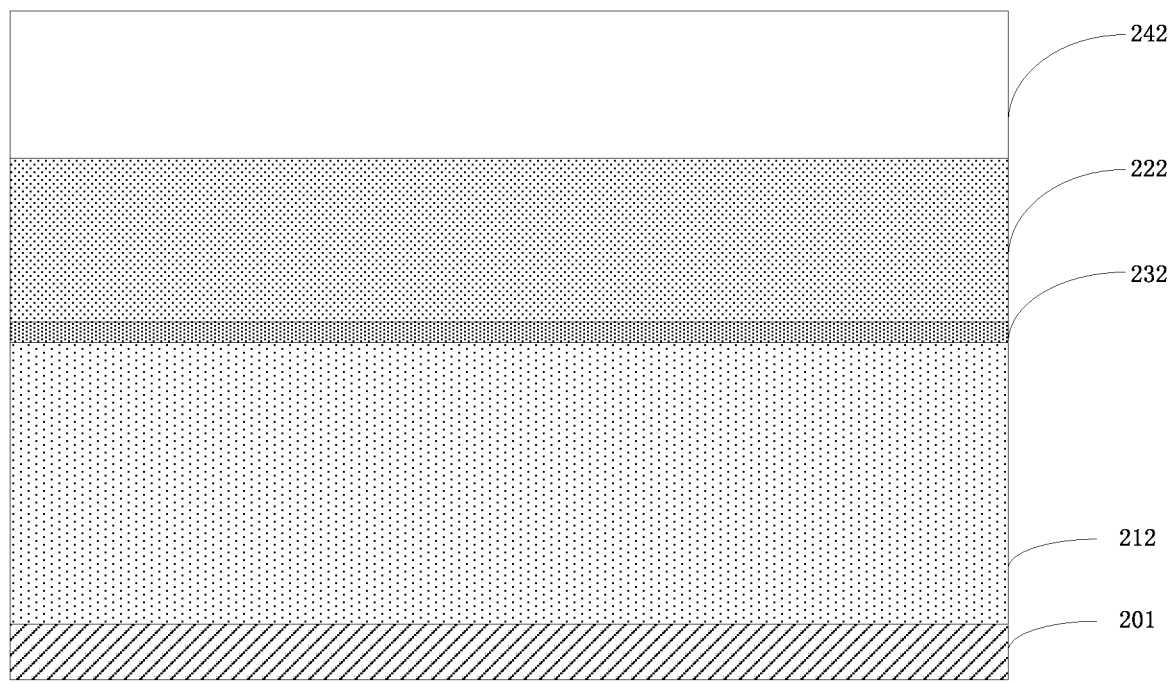
FIG. 4A shows a cross cross-sectional view of the formation of a substrate structure according to another embodiment of the present invention.

First, as shown in FIG. 4A, an initial substrate structure is provided. The initial substrate structure includes a conductive layer 201, a first semiconductor layer 212 on the conductive layer 201, a second semiconductor layer 222 on the first semiconductor layer 212, and an aluminum layer 242 on the second semiconductor layer 222. A PN junction is formed at a contact interface 232 between the first semiconductor layer 212 and the second semiconductor layer 222.

Figure 4B:
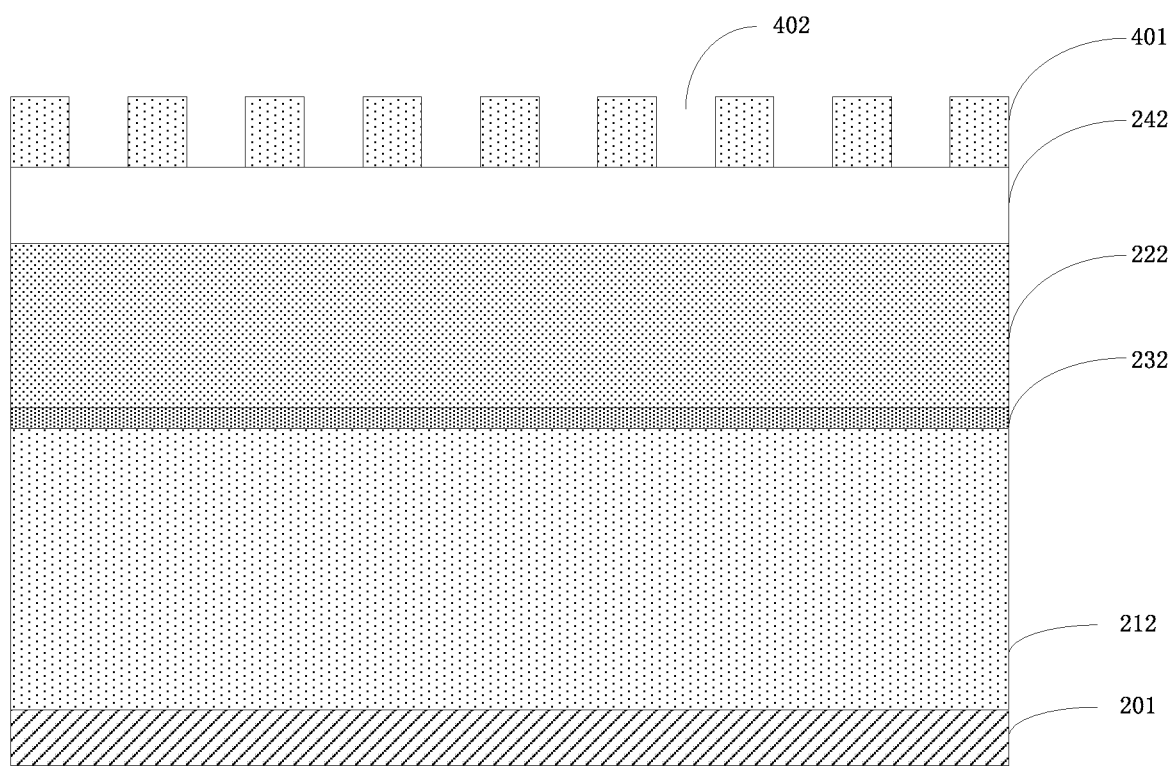
FIG. 4B shows a cross cross-sectional view of the formation of a substrate structure according to another embodiment of the present invention.

Then, as shown in FIG. 4B, an upper portion of aluminum layer 242 is oxidized to form an aluminum oxide layer 401 using an anodizing process. Aluminum oxide layer 401 includes a plurality of nanopores 402. The plurality of nanopores 402 extends from the upper surface of the aluminum oxide layer 401 to a lower portion of aluminum layer 242. It should be understood that, as used herein, the terms "upper" and "lower" are only a relative concept, that is, relative to the lower portion of aluminum layer 242, the nanopores 402 are located at an upper portion of the aluminum layer 242.

In one embodiment, the lateral dimensions of the nanopores (e.g., diameter) may be 5-5000 nm, e.g., 10 nm, 50 nm, 100 nm, 1000 nm, 3000 nm, and the like. In one embodiment, the above-described anodic oxidation process may include the use of ammonium pentaborate and neutral solution of ammonium adipate and/or include phosphoric acid and oxalic acid electrolyte at a voltage of 0-100 V. However, the present disclosure is not limited thereto. One skilled in the art, in accordance with the teachings of the present disclosure, can adjust the process conditions of the anodic oxidation process to obtain nanopores with different lateral dimensions.

It should be noted that the "horizontal dimension" herein nanopore/pillar refers to the size and direction of the nanopore/pillar extending perpendicular to the direction of, for example, the nanopore extending vertically downward.

Figure 4C:
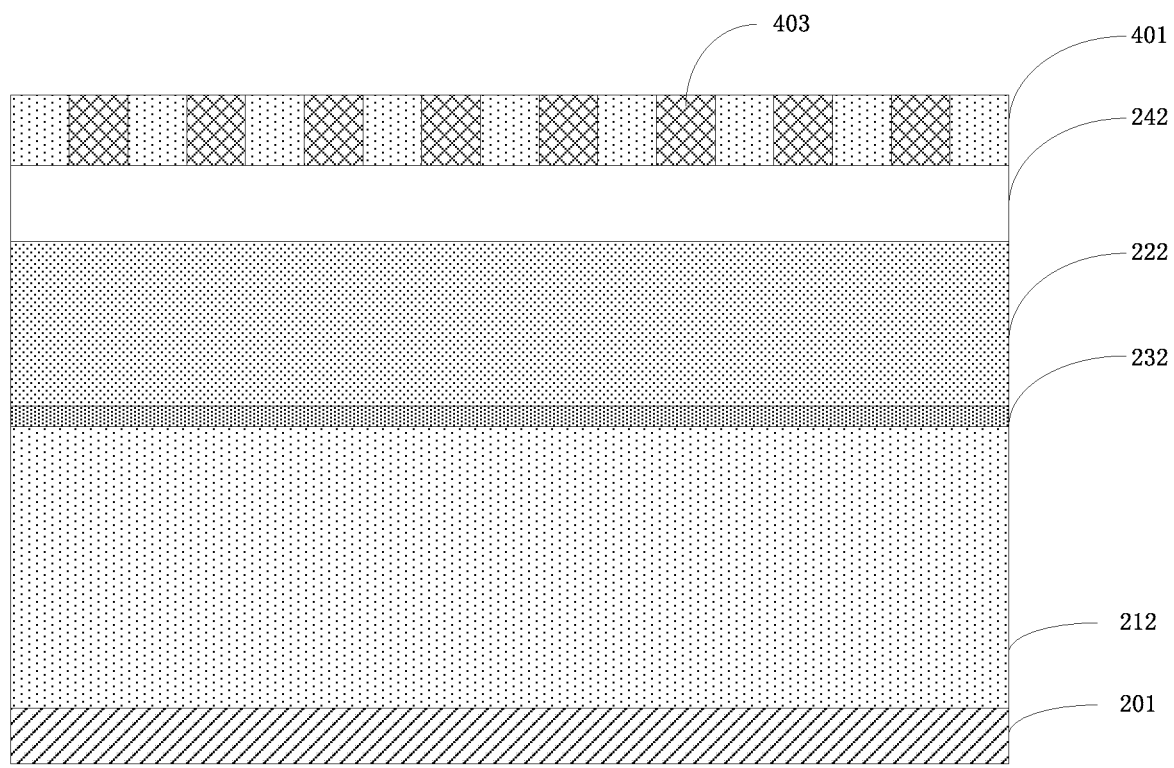
FIG. 4C shows a cross cross-sectional view of a stage of forming a substrate structure according to another embodiment of the present invention.

Next, as shown in FIG. 4C, the plurality of nanopores 402 are filled with a hard mask material 403. For example, titanium nitride may be deposited as a hard mask material 402 to fill the holes and cove the plurality of nanopores in aluminum oxide layer 401. After the hard mask material is planarized, e.g., using chemical mechanical polishing (CMP), the surface of the aluminum oxide layer 401 is substantially flush with the surface of hard mask material 403.

Figure 4D:
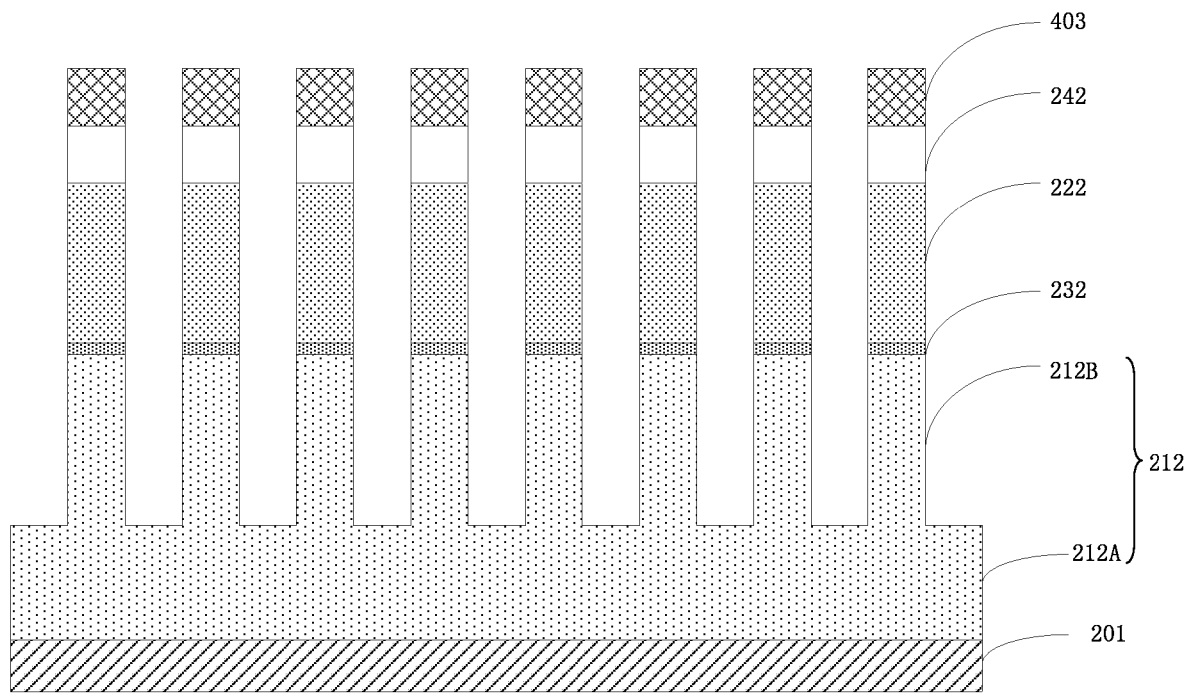
FIG. 4D shows a cross cross-sectional view of a stage of formation of a substrate structure according to another embodiment of the present invention.
Figure 4E:
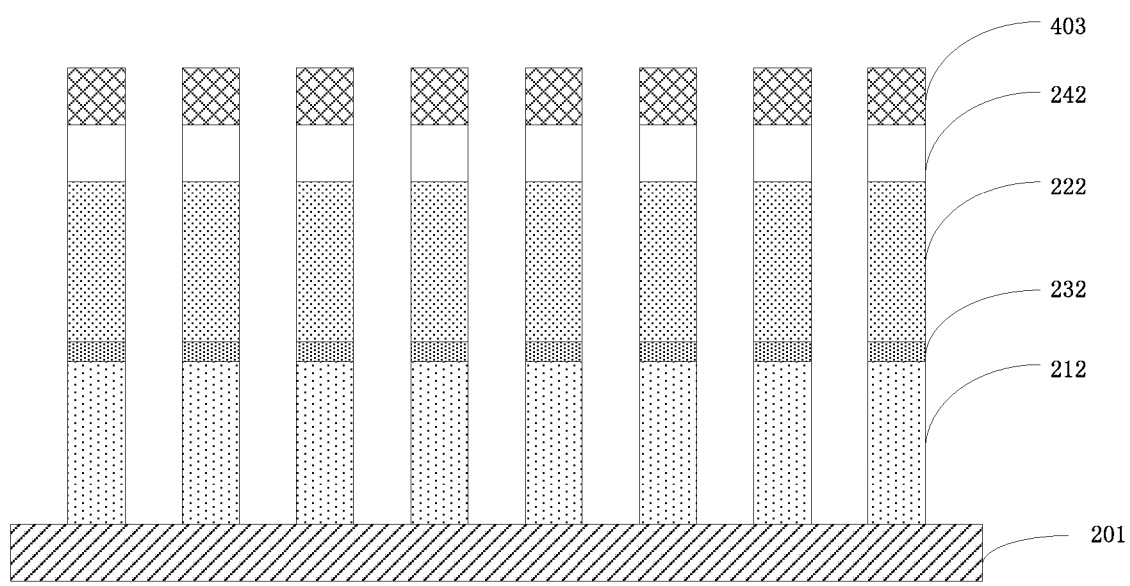
FIG. 4E shows a cross cross-sectional view of a stage of forming a substrate structure of the present embodiment of the present invention.

Next, as shown in FIGS. 4D and 4E, with hard mask 403 as an etching mask, an etching process is carried out to sequentially etch the aluminum oxide layer 401, the lower portion of aluminum layer 242, the second semiconductor layer 222, and at least a portion of the first semiconductor layer 212. In one embodiment, the material of the first semiconductor layer 212 and the second semiconductor layer 222 may include silicon. In an embodiment, the second semiconductor layer 222 may be used as a plasma etching stop layer, and aluminum oxide layer 401 and the lower portion of aluminum layer 242 can be etched in a Cl (chlorine) containing plasma. For example, BCl₃ can be used as a source gas for Cl containing plasma. In some embodiments, a F (florine) containing plasma can be used to etch the second semiconductor layer 222 and at least a portion the first semiconductor layer 212.

In one implementation, shown in FIG. 4D, only a portion of the first semiconductor layer 212 is removed. The first portion 212A that is not etched is shown in FIG. 3A as the third semiconductor layer 205. The remaining portion of the first semiconductor layer 212B and the second semiconductor layer 222 are part of the nanopillars in FIG. 3A.

In another implementation, as shown in FIG. 4E, the etching of the first semiconductor layer 212 can be stopped on the conductive layer 201.

After removal of the hard mask 403, the substrate structure shown in FIG. 3A is formed. After removing the hard mask 403, the surface of the aluminum layer 242 in the nanopillars can be cleaned to remove the aluminum oxide. In one embodiment, a weak alkaline cleaner may be used, e.g., sodium carbonate or triethanolamine, to clean the surface of aluminum layer 242 of the nanopillars.

Further, the substrate structure shown in FIG. 2A can be formed by removing the aluminum layer 242 from the second semiconductor layer 222.

Heretofore, a semiconductor device according to an embodiment of the present disclosure and a method of manufacturing have been described in detail. In order to avoid obscuring the concepts of the present disclosure, some of the details known in the art are not described, and one skilled in the art will, in light of the above description, fully understand how to implement the technical solution disclosed herein. In addition, the embodiments taught in the present disclosure may be freely combined. It should be understood by those skilled in the art that various modifications may be made to the embodiments described above without departing from the spirit and scope of the present disclosure as defined by the appended claims.

What is claimed is:

1. A method of manufacturing a semiconductor device, comprising:
   providing an initial substrate structure, the initial substrate structure comprising:
   a conductive layer;
   a first semiconductor layer on the conductive layer; and
   a second semiconductor layer on the first semiconductor layer, the first semiconductor layer and the second semiconductor layer having different conductivity types such that a homogeneous PN junction being formed at an interface between the first semiconductor layer and the second semiconductor layer;
   forming an aluminum layer on the second semiconductor layer;
   oxidizing an upper portion of the aluminum layer to form an aluminum oxide layer by an anodic oxidation process in which a plurality of nanopores are formed in the aluminum oxide layer, the plurality of nanopores extending through the aluminum oxide layer into the aluminum layer, but not passing through the aluminum layer;
   filling the plurality of nanopores with a hard mask material;
   using the hard mask material in the plurality of nanopores as an etch mask, sequentially etching the aluminum oxide layer, the aluminum layer, the second semiconductor layer, and a portion of a top portion of the first semiconductor layer to form a plurality of nanopillars spaced apart from each other on a bottom portion of the first semiconductor layer, wherein the plurality of nanopillars are formed by a remaining portion of the top portion of the first semiconductor layer and a remaining portion of the second semiconductor layer;
   removing the hard mask material, the aluminum oxide layer, and the aluminum layer; and
   forming a graphene layer overlying the plurality of nanopillars, the graphene layer being connected to each of the plurality of nanopillars.

2. The method according to claim 1, wherein said initial substrate structure further comprises a substrate, the conductive layer being disposed on the substrate.

3. The method of claim 1, wherein the bottom portion of the first semiconductor layer forms a third semiconductor layer disposed on the conductive layer and the remaining portion of the second semiconductor layer and the remaining portion of the top portion of the first semiconductor layer have a same width, the third semiconductor layer comprising a same material as the first semiconductor layer, the plurality of nanopillars being positioned over the third semiconductor layer.

4. The method as claimed in claim 1, wherein the graphene layer is in contact with the second semiconductor layer.

5. The method according to claim 1, wherein the first semiconductor layer and the second semiconductor layer comprise silicon; and
   sequentially etching comprises:
   using a Cl (chlorine) ion containing plasma, etching the aluminum oxide layer and the aluminum layer with the second semiconductor layer as a plasma etching stop layer;
   using an F (florine) ion containing plasma, etching the second semiconductor layer and the at least one portion of the first semiconductor layer.

6. The method according to claim 1, wherein the anodic oxidation process is carried out with a voltage of 0-100 V utilizing an electrolyte comprising neutral ammonium pentaborate and ammonium adipate, or an electrolyte comprising phosphoric acid and oxalic acid electrolyte, or a combination of both electrolytes.

7. The method according to claim 1, further comprising:
after removing the hard mask material, cleaning a surface of the aluminum layer in the plurality of nanopillars.

8. The method according to claim 1, wherein a transverse dimension of the plurality of nanopores is 5-5000 nm.

9. The method according to claim 1, wherein a transverse dimension of the plurality of nanopillars is 5-5000 nm.

10. The method according to claim 1, wherein forming the graphene layer comprises:
forming the graphene layer on a metal substrate; and
transferring the graphene layer over the plurality of nanopillars.

11. The method according to claim 1, further comprising:
forming a protective layer on the graphene layer.

12. The method according to claim 1, wherein the first semiconductor layer and the second semiconductor layer are formed by a same material.

13. The method according to claim 7, wherein cleaning the surface of the aluminum layer comprises removing the aluminum oxide layer.

14. The method according to claim 7, wherein cleaning the surface of the aluminum layer comprises using an alkaline cleaner comprising sodium carbonate or triethanolamine.

15. The method according to claim 5, wherein sequentially etching comprises using the F ion containing plasma, etching the first semiconductor layer with the conductive layer as a plasma etching stop layer.

16. The method according to claim 1, after filling the plurality of nanopores with the hard mask material, further comprising:
planarizing the hard mask material until a surface of the hard mask material is flush with a surface of the plurality of nanopores.

17. The method according to claim 16, wherein the hard mask material comprises titanium nitride.

* * * * *